United States Patent [19]
Takeda

[11] Patent Number: 5,807,648
[45] Date of Patent: Sep. 15, 1998

[54] PHOTO-MASK HAVING OPTICAL FILTERING LAYER ON TRANSPARENT SUBSTRATE UNCOVERED WITH PHOTO-SHIELD PATTERN AND PROCESS OF FABRICATION

[75] Inventor: Kazuhiro Takeda, Tokyo, Japan

[73] Assignee: NEC Corporation, Japan

[21] Appl. No.: 751,816

[22] Filed: Nov. 19, 1996

[30] Foreign Application Priority Data

Nov. 27, 1995 [JP] Japan ..................... 7-307056

[51] Int. Cl.[6] ...................................... G03F 9/00
[52] U.S. Cl. ................................................. 430/5
[58] Field of Search ................ 430/5, 322, 324, 430/269

[56] References Cited

U.S. PATENT DOCUMENTS 5,536,602  7/1996  Nakao .......................................... 430/5

FOREIGN PATENT DOCUMENTS 61-210358  9/1986  Japan .
815848  3/1992  Japan .

*Primary Examiner*—S Rosasco
*Attorney, Agent, or Firm*—Hayes, Soloway, Hennessey, Grossman & Hage, P.C.

[57] ABSTRACT

A photo mask has optical filters on transparent portions of a transparent substrate exposed to openings formed in a photo shield layer, and the optical filters are formed from a photo polymerization material layer in such a manner as to have different thickness depending upon the size of the openings, thereby decreasing the transmittance of the optical filters inversely proportional to the size of the openings.

10 Claims, 8 Drawing Sheets

PHOTO-MASK HAVING OPTICAL FILTERING LAYER ON TRANSPARENT SUBSTRATE UNCOVERED WITH PHOTO-SHIELD PATTERN AND PROCESS OF FABRICATION

FIELD OF THE INVENTION

This invention relates to a photo-mask used in an optical image transferring system and, more particularly, to a photo-mask having an optical filtering layer on a transparent substrate uncovered with a photo-shield pattern and a process of fabrication thereof.

DESCRIPTION OF THE RELATED ART

While a semiconductor integrated circuit device is being manufactured, various conductive patterns and interlevel insulating layers are alternately laminated on a semiconductor substrate, and the conductive patterns are usually formed through lithographic techniques. Namely, photo-resist solution is spread over a target layer, and the photo-resist is baked so as to cover the target layer with a photo-resist layer. A pattern image is optically transferred from a photo-mask to the photo-resist layer, and a latent image is formed in the photo-resist layer. The photo-resist layer is developed in developing solution, and the photo-resist layer is formed into a photo-resist mask. Using the photo-resist mask, the target layer is selectively etched away, and is formed into the pattern image.

The circuit components of an integrated circuit are getting smaller and smaller, and, accordingly, an optical image transferring system is expected to exactly form a latent image of a miniature pattern to a photo-resist layer. A pattern on a photo-mask is broken down into two groups, i.e., a photo-shield pattern and a photo-transparent pattern. A non-transparent area on the photo-mask is, by way of example, covered with a chromium film.

FIGS. 1A to 1D illustrate a typical example of the process of fabricating a photo-mask. The prior art process starts with preparation of a transparent substrate 1. Chromium is deposited over a major surface of the transparent substrate 1 by using a sputtering or an evaporation, and the major surface is covered with a chromium layer 2. Electron-resist solution is spread over the chromium layer 2, and is baked so as to cover the chromium layer 2 with a photo-resist layer 3 as shown in FIG. 1A.

Subsequently, a pattern is directly drawn by using an electron beam, and a latent image is formed in the electron beam resist layer 3. Optical beam is available for the direct wiring. When the optical beam is used for the direct wiring, photo-resist solution is spread instead of the electron beam resist solution. The electron beam resist layer 3 is selectively removed in developing solution, and the latent image is developed into an electron beam resist mask 3a as shown in FIG. 1B. The resist mask 3a may be formed through a contact printing method or a proximity exposure method.

The electron beam resist mask 3a has wide grooves 3b and 3c and a narrow groove 3d. The wide grooves 3b and 3c are wider than the minimum pattern width which the direct wiring can form in the electron-resist layer 3. On the other hand, the narrow groove 3d has the minimum pattern width.

Subsequently, using the electron beam resist mask 3a, the chromium layer 2 is selectively etched away by using a wet etching or a reactive ion etching. The chromium exposed to the grooves 3b to 3d is etched away. However, the electron beam resist mask 3a prevents the chromium layer therebeneath from the etchant, and a photo-shield pattern 2a is left on the transparent substrate 1 beneath the electron beam resist layer 2a as shown in FIG. 1C. The transparent substrate 1 is exposed to the grooves 3b to 3c.

The electron beam resist mask 2a is stripped off, and the transparent substrate 1 and the photo-shield pattern 2a and the transparent substrate 1 uncovered with the photo-shield pattern 2a form a mask pattern as shown in FIG. 1D. The prior art photo mask is subjected to a mask inspection. In the inspection, an inspector examines a pattern defect, a shift of pattern, a dimensional error and a dispersion of dimensional error and so fourth. If a pattern is missing or a pin spot is found, the photo mask is repaired by using a repairing technique of the clear/opaque defect. An evaporation of carbon and a laser trimming may be used in the repairing work.

However, dispersion of dimensional error is hardly repaired by using the presently available repairing techniques. For this reason, when the mask pattern is optically transferred to a semiconductor wafer, the dispersion of dimensional error strongly affects the finished dimension of the pattern transferred to the semiconductor wafer.

A pattern image for through-holes is one of the most difficult patterns to transfer to a semiconductor wafer. Current manufacturing techniques suffer from bad mask linearity, i.e., fidelity of finished dimension on a semiconductor wafer to a dimension of the mask pattern. In fact, the pattern transfer magnifies the dispersion of dimensional error two or three times on the semiconductor wafer. If the through-holes are designed to have a diameter equal to the minimum pattern width on the semiconductor wafer, an optical transfer and the development do not pierce the resist layer at the hole forming areas due to the dispersion of dimensional error.

In order to pierce the resist layer at all of the hole forming areas, current manufacturing techniques may regulate the exposure conditions to those through-hole with a diameter equal to the minimum pattern width. However, the exposure conditions can cause an over-exposure of through-holes with a diameter greater than the minimum pattern width, and thus these through-holes have finished diameters larger than the designed diameter.

FIG. 2 illustrates the relationship between the mask linearity and exposure time. T1, T2 and T3 are representative of a target diameter of small-sized through-holes on a wafer, a target diameter of middle-sized through-holes on the wafer and a target diameter of large-sized through-holes on the wafer, respectively. The small-sized through-holes have the target diameter T1 equal to the minimum pattern width. The pattern image for the small-sized through-holes, the middle-sized through-holes and the large-sized through-holes is optically transferred from the prior art photo mask to a photo-resist layer on the wafer for forming a latent image, and the latent image is developed into the small-sized through-holes, the middle-sized through-holes and the large-sized through-holes. When the exposure time is increased, the actual diameter of the small-sized through-holes, the actual diameter of the middle-sized through-holes and the actual diameter of the large-sized through-holes are increased as indicated by plots PL1, PL2 and PL3, respectively.

If the exposure time is regulated to an appropriate value t1 for the large-sized through-holes, the actual diameter of the small-sized through-holes is too small to pierce the photo-resist layer. If the exposure time is regulated to an appropriate value t2 for the middle-sized through-holes, the large-sized through-holes are excessively etched to have a larger diameter, and the small-sized through-holes still do not pierce the photo-resist layer. On the other hand, if the exposure time is regulated to an appropriate value t3 of the small-sized through-holes, the large-sized through-holes and the middle-sized through-holes suffer from the over-etching. Thus, when dimensional error is introduced into the prior art photo mask, the lithography magnifies the dimensional error, and the dimensional error is transferred to the resist mask. As a result, the prior art photo mask gradually decreases in nesting tolerance on the semiconductor wafer during repetition of the pattern transfer.

SUMMARY OF THE INVENTION

It is therefore an important object of the present invention to provide a photo mask which decreases the dispersion of dimensional error on a wafer.

It is also an important object of the present invention to provide a process of fabricating the photo-mask.

To accomplish the object, the present invention proposes to equalize the quantity of light incident onto a photosensitive layer through different sized transparent areas.

In accordance with one aspect of the present invention, there is provided a photo mask comprising a substrate having a first transmittance, a shield pattern having a second transmittance smaller than the first transmittance and having a plurality of shield portions formed on a major surface of the substrate and spaced from one another by openings of different size, and a filtering layer having a plurality of filtering portions respectively overlapped with the openings and different in transmittance depending upon the size of the openings, and the transmittances of the plurality of filtering portions is larger than the second transmittance and smaller than the first transmittance.

In accordance with another aspect of the present invention, there is provided a process of fabricating a photo mask comprising the steps of a) preparing a substrate formed of a first material having a first transmittance, b) forming a shield pattern of a second material having a second transmittance smaller than the first transmittance, the shield pattern having a plurality of shield portions spaced from one another by openings different in size, c) overlapping the shield pattern and portions of the substrate exposed to the openings with a photo polymerization material layer, and d) forming optical filters from the photo polymerization material layer over the openings, respectively, in such a manner as to have different thicknesses for imparting different transmittances larger than the second transmittance and smaller than the first transmittance thereto in dependence on the size of the openings.

BRIEF DESCRIPTION OF THE DRAWINGS

The features and advantages of the photo-mask and the process of fabricating a photo-mask according to the present invention will be more clearly understood from the following description taken in conjunction with the accompanying drawings in which.

DESCRIPTION OF THE PREFERRED EMBODIMENTS

First Embodiment

Figure 3:
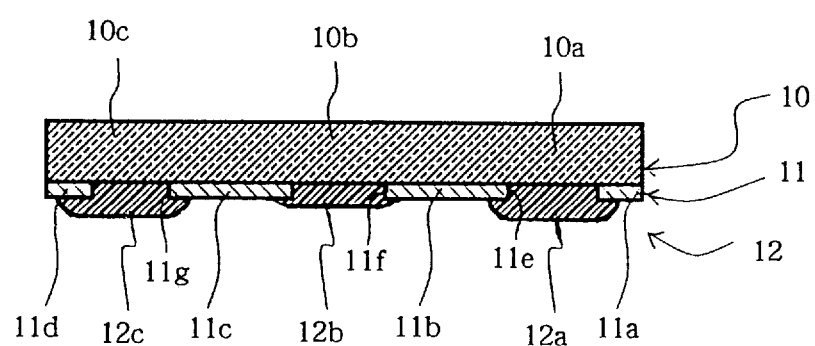
FIG. 3 is a cross sectional view showing a photo mask according to the present invention.

Referring to FIG. 3 of the drawings, a photo mask embodying the present invention comprises a transparent substrate 10, a photo-shield pattern 11 formed on a major surface of the transparent substrate 10 and an optical filtering layer 12 formed on the transparent substrate 10 uncovered with the photo-shield pattern. The transparent substrate 10 is formed of quartz, and the photo-shield pattern 11 is formed of metal such as, for example, chromium.

The major surface of the transparent substrate 10 is partially covered with the photo-shield pattern 11, and is partially uncovered therewith. As a result, the photo-shield pattern 11 has photo-shield portions 11a, 11b, 11c and 11d, and openings 11e, 11f and 11g which separate the photo-shield portions 11a to 11d from one another. The opening 11f is as narrow as the minimum pattern width, and the openings 11e and 11g are wider than the minimum pattern width.

The transparent substrate 10 is partially exposed to the openings 11e to 11g, and the transparent portions 10a and 10c are wider than the transparent portion 10b. The optical filtering layer 12 has optical filters 12a, 12b and 12c, and the transparent portions 10a to 10c are respectively covered with the optical filters 12a, 12b and 12c. The thickness of the optical filters 12a to 12c is in dependence on the size of the transparent portions 10a to 10c. In this instance, the optical filters 12a and 12c are thicker than the optical filter 12b, because the transparent portions 10a and 10c are wider than the transparent portion 10b.

Figure 4A:
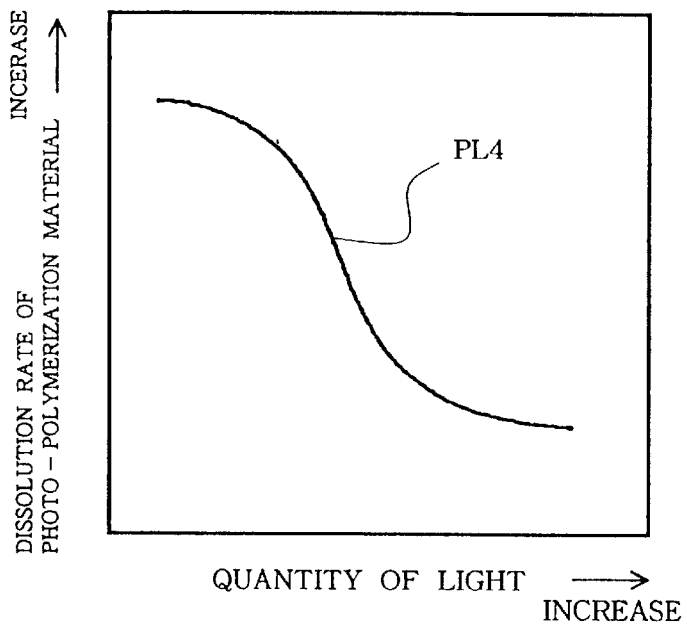
FIG. 4A is a graph showing a relation between a solving speed of photo polymerization material and the quantity of light radiated onto the photo polymerization material.
Figure 4B:
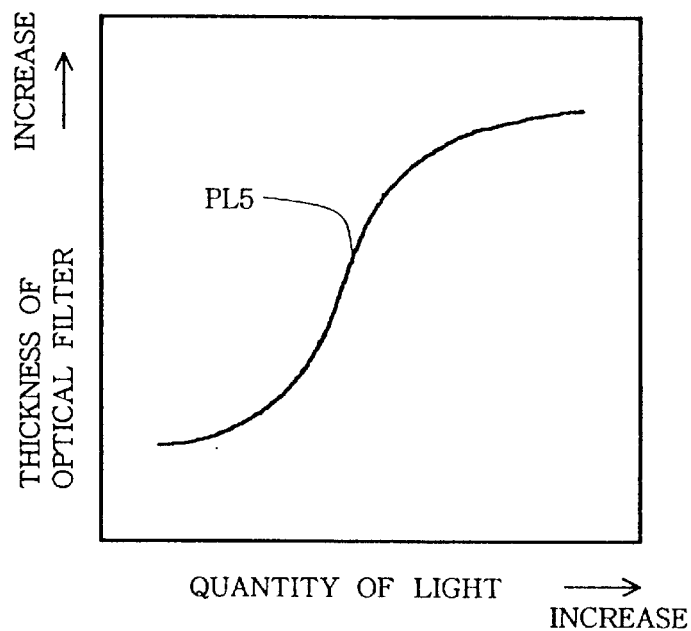
FIG. 4B is a graph showing a relation between a residual thickness of the photo polymerization material and the quantity of light.

Light with a predetermined wavelength promotes the polymerization of the photo polymerization material, and the polymerization residue is inversely decreased by increasing the quantity of light incident onto the photo polymerization material layer. The polymerization residue is dissolved in solvent, and the percentage of the polymerization residue to be dissolved in solvent is decreased as indicated by plots PL4 in FIG. 4A. The optical filters 12a to 12c are formed of the polymer, and, accordingly, are not dissolved in the solvent. For this reason, the thickness of the optical filters 12a to 12c is increased together with the quantity of light incident onto the photo polymerization material layer as indicated by plots PL5 in FIG. 4B. The quantity of light is linearly increased with time on the assumption that the luminous flux is unchanged. Therefore, the thickness of the optical filters 12a to 12c is proportionally increased with time. It is recommendable to use photo polymerization material continuously increasing the polymer with time.

The transmittance of the optical filters 12a to 12c is inversely proportional to the thickness thereof, and, for this reason, the transmittance is controllable by exposing a photo polymerization material layer to optical radiation.

Description is hereinbelow made on a process of fabricating the photo mask with reference to FIGS. 5A to 5F. The fabrication process starts with preparation of the transparent substrate 10 formed of quartz. On the major surface of the transparent substrate 10 is deposited a chromium layer 13 which a sputtering or an evaporation is available for.

Figure 5A:
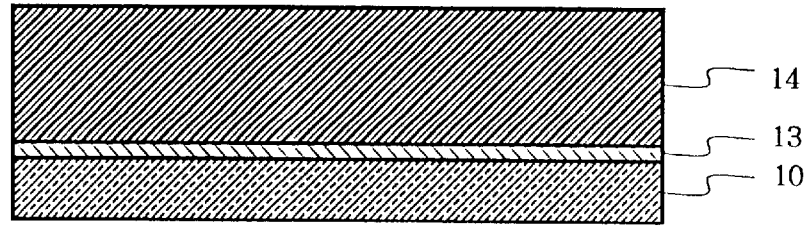
FIGS. 5A to 5F are cross sectional views showing a process of fabricating the photo mask according to the present invention.

Electron beam resist solution is spread over the entire surface of the chromium layer 13, and is baked so as to cover the chromium layer 13 with an electron beam resist layer 14. The resultant structure is illustrated in FIG. 5A.

Subsequently, an electron beam directly writes a circuit pattern on the electron beam resist layer 14, and a latent image is formed in the electron beam resist layer 14. Optical beam is also available for the direct writing, and the electron beam resist layer 14 is replaced with a photo-resist layer for the direct writing with the optical beam. If a master mask has been already fabricated, the circuit pattern may be transferred from the master mask to a resist layer on the chromium layer 13 through a proximity exposure method or a contact printing method.

Figure 5B:
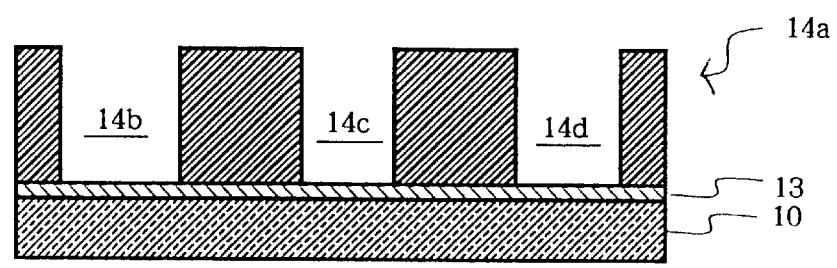

The latent image for the circuit pattern is developed so as to partially remove the electron beam resist layer 14. Then, the electron beam resist layer 14 is formed into an etching mask 14a, and openings 14b to 14d are formed into the electron beam resist layer 14 in correspondence to the openings 11e to 11g, respectively, as shown in FIG. 5B.

Figure 5C:
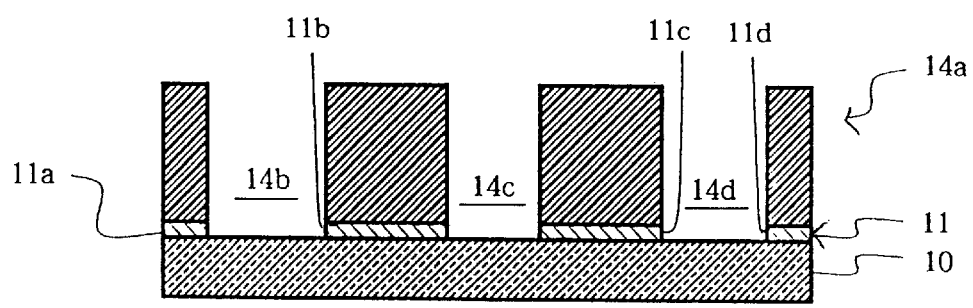

The chromium layer 13 is partially exposed to the openings 14b to 14d, and the exposed portions of the chromium layer 13 are etched away by using a wet etching or a reactive ion etching. Thus, the photo-shield pattern 11 is formed from the chromium layer 13 as shown in FIG. 5C.

Figure 5D:
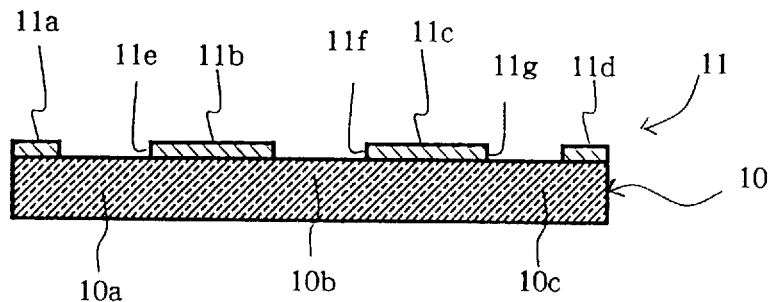

The etching mask 14a is stripped off. The chromium layer covered with the etching mask 14a are left on the major surface of the transparent substrate 10, and serve as the photo-shield portions 11a to 11d. The openings 11e to 11g are formed between the photo-shield portions 11a to 11d as shown in FIG. 5D.

Photo polymerization material is dissolved in appropriate solvent, and the is spread over the photo-shield pattern 11 and the exposed areas of the transparent substrate 10. The photo-shield pattern 11 and the exposed areas are covered with the photo polymerization material layer 15. The photo polymerization material layer 15 is substantially uniform in thickness.

Dye-containing negative resist sensitive to i-ray is available for the photo polymerization material layer 15, and polymerization residue of the dye-containing negative resist is dissolved in developing solution usually used in a development of a latent image formed in the dye-containing negative resist layer.

Figure 5E:
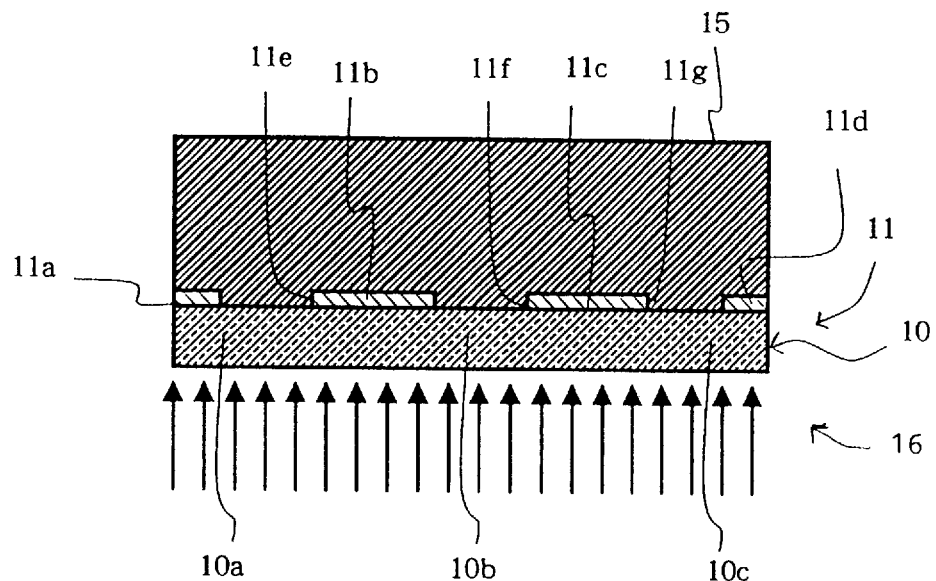

Light 16 is radiated onto a reverse surface of the transparent substrate 10 as shown in FIG. 5E. Although the photo-shield pattern 11 reflects the light 16, the transparent portions 10a to 10c allow the light 16 to pass therethrough, and the light 16 selectively polymerizes the photo polymerization material layer 15.

When novolak-based i-ray resist is used for the photo polymerization material layer 15, KrF eximer laser is radiated through the transparent substrate 10 to the novolak-based i-ray resist layer, because the novolak-based i-ray resist layer is low in transmittance to the light with the wavelength of 248 nanometers.

The openings 11e and 11g are larger in size than another opening 11f, and the quantity of light passing through the openings 11e/11g is more than that passing through the opening 11f. The larger quantity of light 16 promotes the photo polymerization in the portion over the opening 11e rather than the portion over the other opening 11g. The larger the size is, the thicker the polymer is. Thus, the polymer over the wide openings 11e/11g become thicker than the polymer over the narrow opening 11f.

Figure 5F:
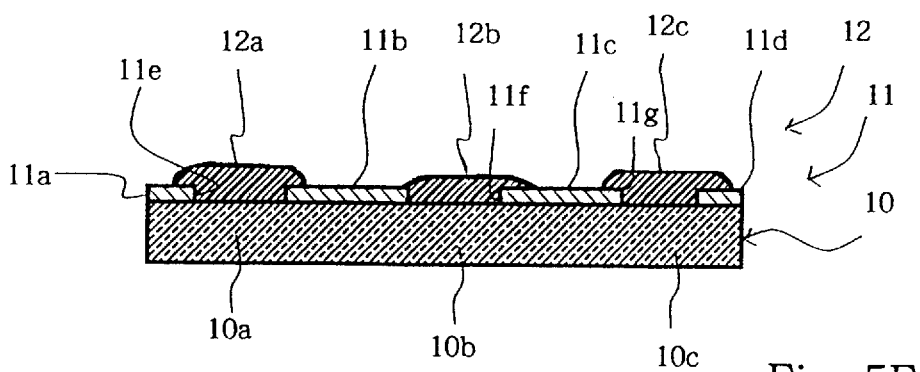

Finally, the polymerization residue is removed in appropriate solvent, and the polymer is baked on a hot plate for volatilizing the solvent. The optical filters 12a to 12c are left on the transparent portions 10a to 10c as shown in FIG. 5F, and the photo mask according to the present invention is completed. The openings 11e and 11g are wider than the opening 12b, and the optical filters 12a and 12c are thicker than the optical filter 12b.

Figure 1A:
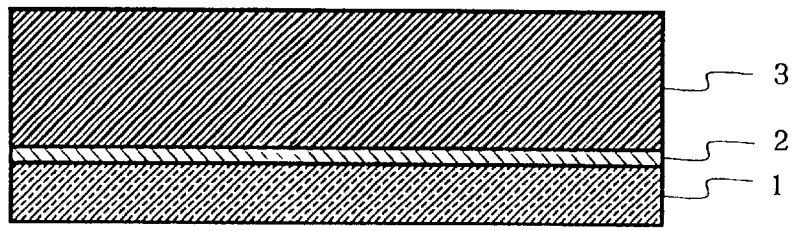
FIGS. 1A to 1D are cross sectional views showing the prior art process of fabricating a photo-mask.
Figure 1B:
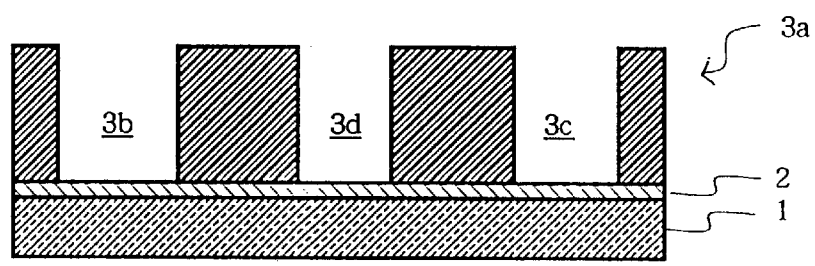
Figure 1C:
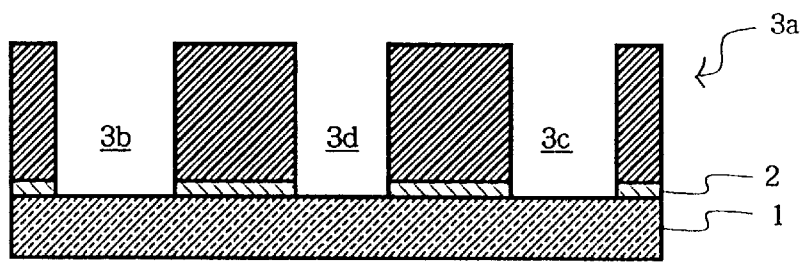
Figure 1D:
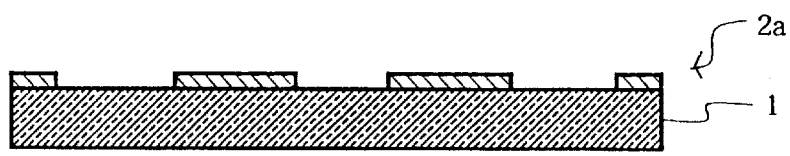
Figure 2:
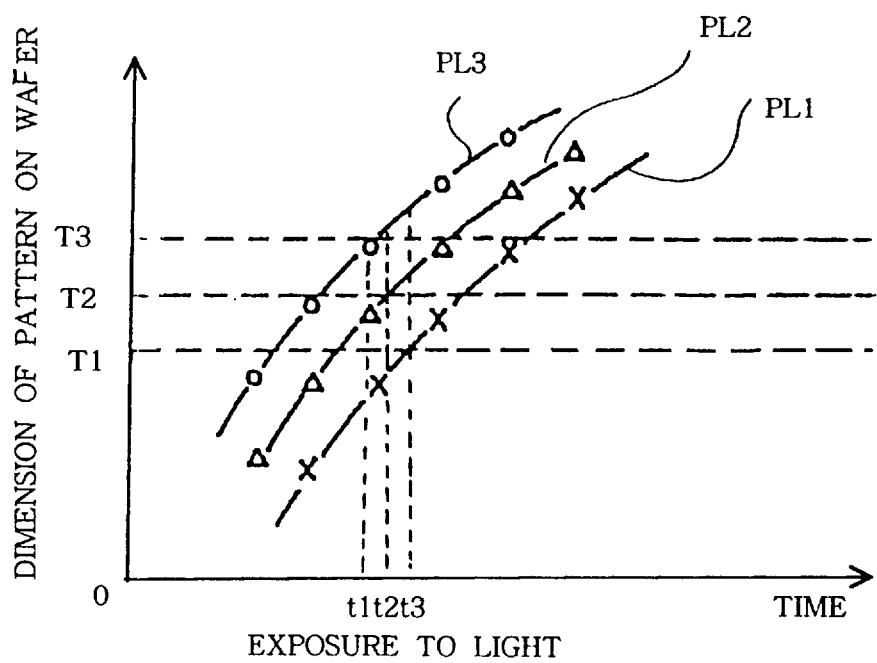
FIG. 2 is a graph showing the relation between the mask linearity and the exposure time.

As described in connection with FIG. 2, a wider opening allows much light to be incident onto a photo-resist layer on a semiconductor wafer rather than a narrow opening. In this instance, the openings 11e and 11g are wider than the opening 11f, and the openings 11e and 11g allow a larger quantity of light to be incident onto a photo-resist layer on a semiconductor wafer rather than the opening 11f. However, the wider openings 11e and 11g is covered with the optical filters 12a and 12c thicker than the optical filter 12b over the narrow opening 11f, and the thick optical filters 12a and 12c decrease the transmittance rather than the thin optical filter 12b. Thus, the thick optical filters 12a and 12c cancel the increment of light due to the dimensional difference between the openings 11e/11g and the opening 11f, and prevent the portions of the photo-resist layer on the semiconductor wafer from excess exposure to light passing through the wide openings 11e/11g. In other words, the optical filters 12a to 12c improve the mask linearity, and minimize a dimensional error of a photo resist mask on a semiconductor wafer due to the difference in size between the openings 11e to 11g on the photo mask.

The self-regulatory photo mask according to the present invention is further effective against a dimensional error in the openings 11e to 11g. Even if a photo-shield pattern on a photo mask has a plurality of openings designed to be equal in size, a dimensional error unavoidably takes place in the openings, and some openings may be larger than the others. However, optical filters over the wide openings are thicker than those over the other openings, and the thick filters decrease the transmittance of the optical filters over the wide openings. As a result, the quantity of light incident through the wide openings onto a photo-resist layer is not so much as the quantity of light incident through the wide openings of the prior art photo mask, and the optical filters according to the present invention prevent the photo-resist layer on the semiconductor wafer from the undesirable multiplication due to the dimensional difference.

Second Embodiment

Figure 6A:
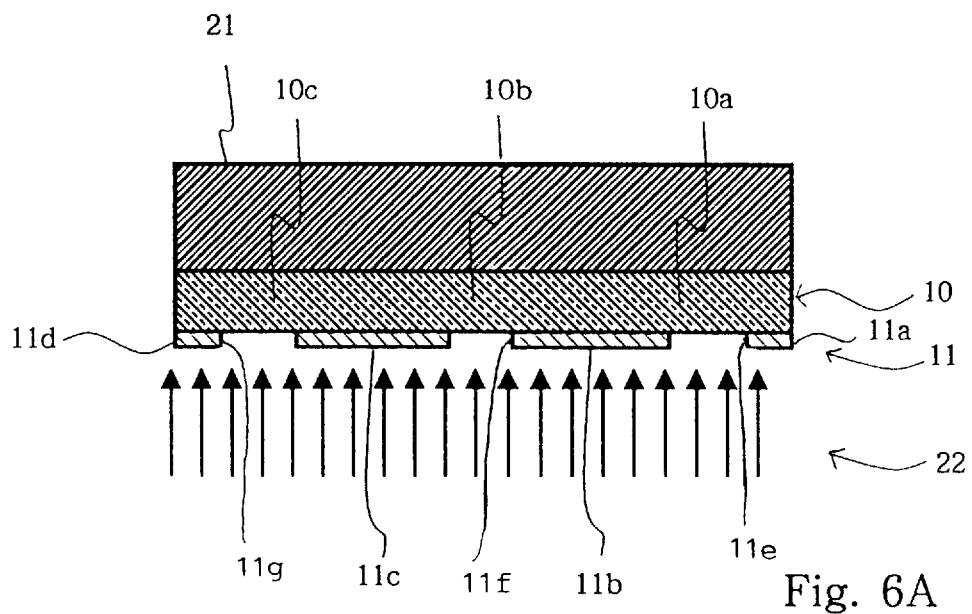
FIGS. 6A and 6B are cross sectional views showing another process of fabricating a photo mask according to the present invention.
Figure 6B:
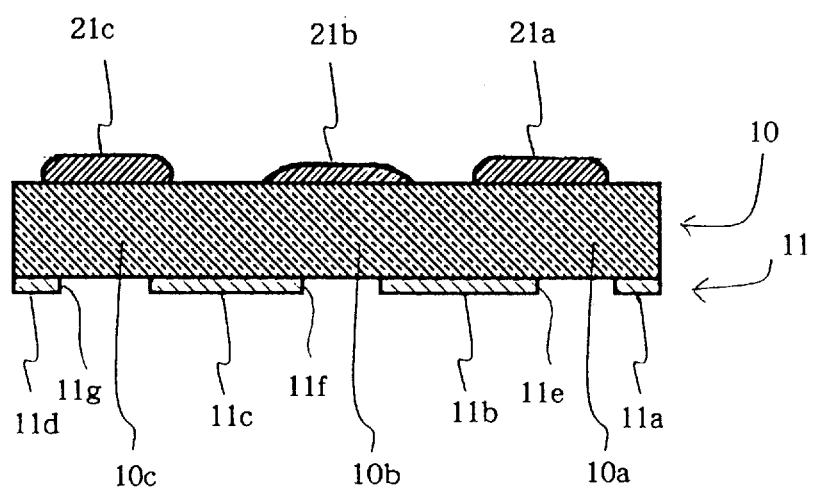

FIGS. 6A and 6B illustrate essential steps of another fabrication process embodying the present invention. The process implementing the second embodiment is similar to that of the first embodiment until the photo-shield pattern 11 is formed on the transparent substrate 10, and, for this reason, description is focused on steps for forming optical filters.

When the photo-shield pattern 11 is formed on the major surface of the transparent substrate 10, photo polymerization material is spread over the reverse surface of the transparent substrate 10 as shown in FIG. 6A.

Light 22 is radiated to the photo-shield pattern 11 and the transparent portions 10a to 10c as shown in FIG. 6A. Although the photo-shield pattern 11 reflects the light 22, the light 22 passes through the transparent portions 10a to 10c, and promotes the polymerization of the photo polymerization material. The thickness of polymer is in dependence on the quantity of light 22 radiating the photo polymerization material layer 21 as described hereinbefore.

The polymerization residue is removed in appropriate solvent, and the polymer is baked so as to form optical filters 21a to 21c over the openings 11e to 11g as shown in FIG. 6B. The optical filters 21a to 21c are different in thickness depending upon the size of the openings 11e to 11g as similar to the first embodiment.

The photo mask implementing the second embodiment achieves all the advantages of the first embodiment.

Figure 7:
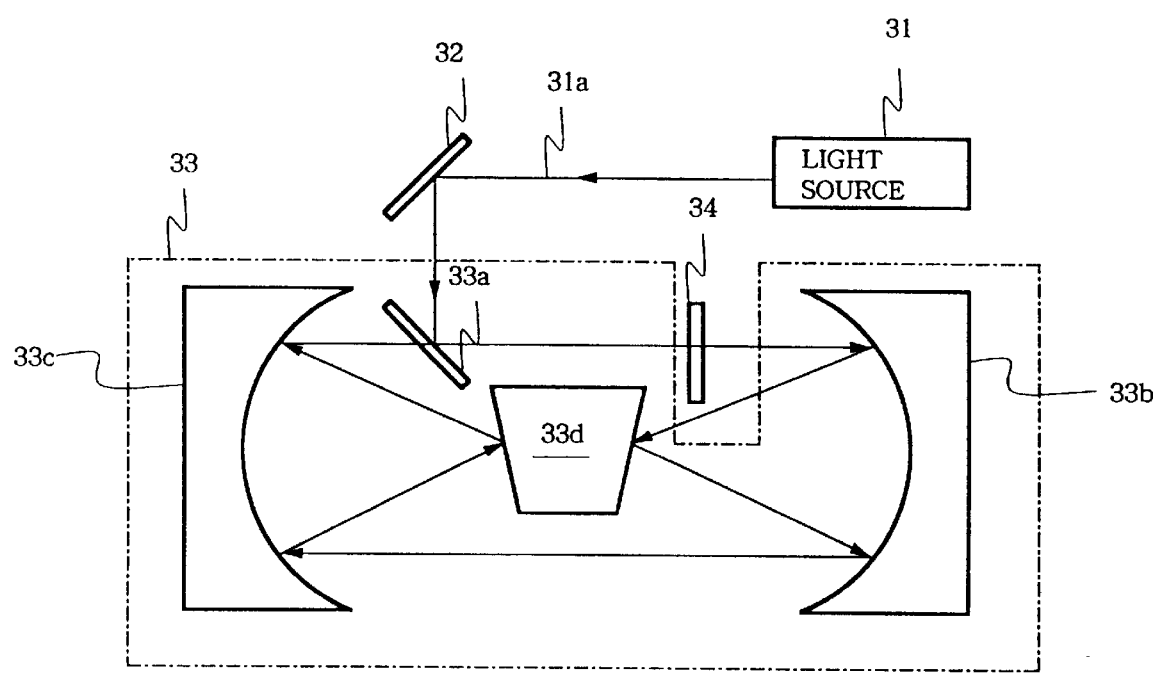
FIG. 7 is a schematic view showing an exposure system used in the process according to the present invention.

FIG. 7 is an exposure system available for the fabrication process according to the present invention. The exposure system comprises a light source 31, a reflecting mirror 32 and an optical differential amplifier 33. A photo-shield pattern has been already formed on a transparent substrate of the reticle 34, and an optical filtering layer (not shown) is patterned on the transparent substrate by using the exposure system. The reticle is used in an optical pattern transfer by using a reduction projection aligner.

The optical differential amplifier 33 includes a half mirror 33a, a pair of concave mirrors 33b and 33c and a trapezoidal mirror 33d. A light beam 31a is radiated from the light source 31, and is directed by the reflecting mirror 32 toward the half mirror 33a. The half mirror 33a partially reflects the light beam 31a toward the reticle 34, and the light beam promotes the polymerization on the reticle 34. The light beam passes through the photo-shield pattern and the photo polymerization material layer, and is reflected by the concave mirrors 3b/33c and the trapezoidal mirror 33d. The light beam reflected on the concave mirror 33c is directed to the half mirror 33a, and is incident through the photo-shield pattern onto the polymerization material layer, again.

The light beam reflected on the concave mirror 33b has a difference in the intensity of light depending upon the size of openings formed in the photo-shield pattern, and the difference in the intensity is magnified by the photo-shield pattern. Thus, the light beam is repeatedly focused onto the reticle 34, and the difference in intensity is magnified through the repetition.

The exposure system is suitable for a photo-shield pattern having openings not widely different.

Although particular embodiments of the present invention have been shown and described, it will be obvious to those skilled in the art that various changes and modifications may be made without departing from the spirit and scope of the present invention.

What is claimed is:

1. A photo mask comprising:

a substrate having a first transmittance;

a shield pattern having a second transmittance smaller than said first transmitance, and having a plurality of shield portions formed on a major surface of said substrate and spaced from one another by openings different in size; and a filtering layer formed of a photo-polymerization material and having a plurality of optical filtering portions respectively overlapped with said openings and different in transmittance depending upon said size of said openings, the transmittances of said plurality of optical filtering portions being larger than said second transmittance and smaller than said first transmittance, said shield pattern being used as a mask for patterning said photo-polymerization material into said optical filtering portions.

2. The photo mask as set forth in claim 1, in which said plurality of optical filtering portions are different in thickness depending upon said transmittance expected thereto.

3. The photo mask as set forth in claim 1, in which said plurality of optical filtering portions respectively fill said openings.

4. The photo mask as set forth in claim 1, in which said plurality of optical filtering portions are formed on another major surface reverse to said major surface.

5. The photo mask as set forth in claim 1, in which said substrate, said shield pattern and said filtering layer are respectively formed of quartz, chromium and resist material sensitive to one of an electron beam and an optical beam.

6. The photo mask as set forth in claim 1, in which said photo mask is used in an optical pattern transfer using a reduction projection aligner.

7. A process of fabricating a photo mask, comprising the steps of:

a) preparing a substrate formed of a first material having a first transmittance;

b) forming a shield pattern of a second material having a second transmittance smaller than said first transmittance, said shield pattern having a plurality of shield portions spaced from one another by openings different in size;

c) laminating a photo polymerization material layer on said substrate so that said polymerization material layer extends over said shield pattern and portions of said substrate exposed to said openings d) radiating light through said openings to said photo polymerization material layer so as to differently polymerize portions of said polymerization material layer over said portions of said substrate depending upon said size of said openings; and e) developing said photo polymerization material layer so as to form said polymerization material layer into optical filters having different thicknesses for imparting different transmittances larger than said second transmittance and smaller than said first transmittance thereto in dependence on said size of said openings.

8. The process as set forth in claim 7, in which said shield pattern is formed on one of two major surfaces of said substrate, and said optical filters fill said openings, respectively.

9. The process as set forth in claim 7, in which said shield pattern is formed on one of two major surfaces of said substrate, and said optical filters are formed on the other of said two major surfaces.

10. The process as set forth in claim 7, in which said step d) includes the sub-steps of d-1) preparing an exposure system having a source of an optical beam, a mirror sub-system for directing said optical beam through said shield pattern to said photo polymerization material layer and an optical differential amplifier for magnifying a difference in intensity of said optical beam due to said shield pattern, d-2) radiating said optical beam from said source through said mirror sub-system and said optical differential amplifier to said photo polymerization material layer overlapped with said shield pattern in such a manner as to differently polymerize said photo polymerization material layer through the magnification of said difference in intensity, and d-3) removing a polymerization residue from said photo polymerization material layer so as to form said optical filters formed of the polymer from said photo polymerization material layer.

* * * * *